(12) United States Patent
Yang et al.

(10) Patent No.: US 9,753,657 B2
(45) Date of Patent: Sep. 5, 2017

(54) DYNAMIC RECONDITIONING OF CHARGE TRAPPED BASED MEMORY

(71) Applicant: SanDisk Technologies Inc., Plano, TX (US)

(72) Inventors: Nian Niles Yang, Mountain View, CA (US); James Fitzpatrick, Sudbury, MA (US); Jiahui Yuan, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 34 days.

(21) Appl. No.: 14/858,480

(22) Filed: Sep. 18, 2015

(65) Prior Publication Data
US 2017/0083249 A1 Mar. 23, 2017

(51) Int. Cl.
G06F 12/00 (2006.01)
G06F 3/06 (2006.01)
G11C 16/16 (2006.01)
G11C 16/04 (2006.01)
G11C 16/34 (2006.01)

(52) U.S. Cl.
CPC ............ *G06F 3/0619* (2013.01); *G06F 3/065* (2013.01); *G06F 3/0688* (2013.01); *G11C 16/0466* (2013.01); *G11C 16/16* (2013.01); *G11C 16/349* (2013.01); *G11C 16/3418* (2013.01); *G11C 16/3431* (2013.01)

(58) Field of Classification Search
CPC ...... G06F 3/0619; G06F 3/0688; G06F 3/065; G11C 16/0466; G11C 16/16; G11C 16/3418
See application file for complete search history.

(56) References Cited

U.S. PATENT DOCUMENTS

2013/0194871 A1* 8/2013 Lin ..................... G11C 16/0483
365/185.17
2016/0111164 A1* 4/2016 Chen ...................... G11C 16/14
365/185.11

* cited by examiner

*Primary Examiner* — John A Lane
(74) *Attorney, Agent, or Firm* — Brinks Gilson & Lione

(57) ABSTRACT

A storage device with a charge trapping (CT) based memory may include improved data retention (DR) performance. The CT memory may be 3D memory that uses a charge storage layer for storing charge may have unique data retention behavior. Memory blocks using a charge storage layer may be dynamically detected and reconditioned and re-programmed to improve memory characteristics, such as data retention. The reconditioning may include a dedicated erase cycle for a block that improves the data retention.

18 Claims, 11 Drawing Sheets

DYNAMIC RECONDITIONING OF CHARGE TRAPPED BASED MEMORY

TECHNICAL FIELD

This application relates generally to memory devices. More specifically, this application relates to improving data retention for memory using charge trapping.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. NAND is one example of a non-volatile flash memory. Flash memory may have a limited endurance, which determines a number of times a particular memory can be erased and re-programmed. As the non-volatile memory cell scales to smaller dimensions with higher capacity per unit area, the cell endurance due to program and erase cycling, and disturbances (e.g. due to either read or program) may become more prominent. The overall vulnerability of memory cells and the defect level during the silicon process may become elevated as the cell dimension shrinks and process complexity increases, which directly affects the data integrity at both the memory and system. For example, data may be stored in a three dimensional (3D) memory to increase an amount of data that may be stored. However, data retention may degrade for compact storage.

DESCRIPTION OF THE EMBODIMENTS

A storage device with a charge trapping (CT) based memory may include improved data retention (DR) performance. The CT memory may be 3D memory that uses a charge storage layer for storing charge may have unique data retention behavior. Memory blocks using a charge storage layer may be dynamically reconditioned and re-programmed to improve memory characteristics, such as data retention. The reconditioning may include an erase cycle for a block that improves the data retention.

Figure 1A:
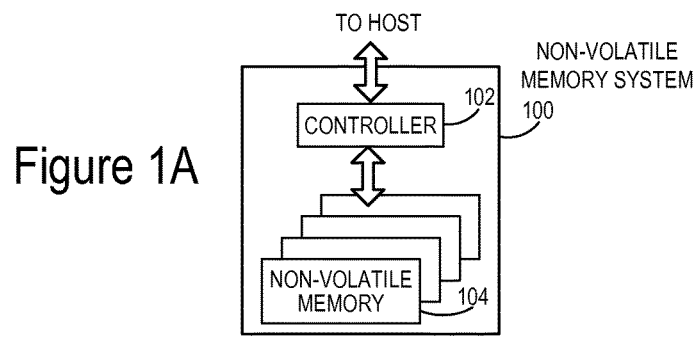
FIG. 1A is a block diagram of an example non-volatile memory system.

FIGS. 1A-2B are exemplary memory systems which may implement reconditioning of CT memory for improved DR performance. FIG. 1A is a block diagram illustrating a non-volatile memory system. The non-volatile memory system 100 includes a controller 102 and non-volatile memory that may be made up of one or more non-volatile memory die 104. As used herein, the term die refers to the set of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104. The non-volatile memory die 104 may store an operating system for the host.

Examples of host systems include, but are not limited to, personal computers (PCs), such as desktop or laptop and other portable computers, tablets, mobile devices, cellular telephones, smartphones, personal digital assistants (PDAs), gaming devices, digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

Although in the example illustrated in FIG. 1A, non-volatile memory system 100 includes a single channel between controller 102 and non-volatile memory die 104, the subject matter described herein is not limited to having a single memory channel. For example, in some NAND memory system architectures, such as in FIGS. 1B and 1C, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

Figure 1B:
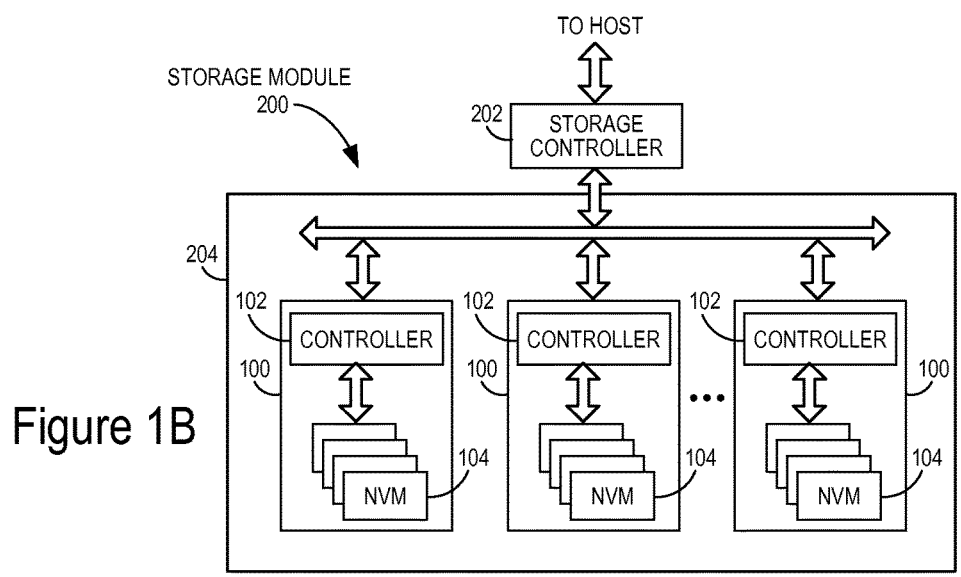
FIG. 1B is a block diagram of a storage module that includes a plurality of non-volatile memory systems.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

Figure 1C:
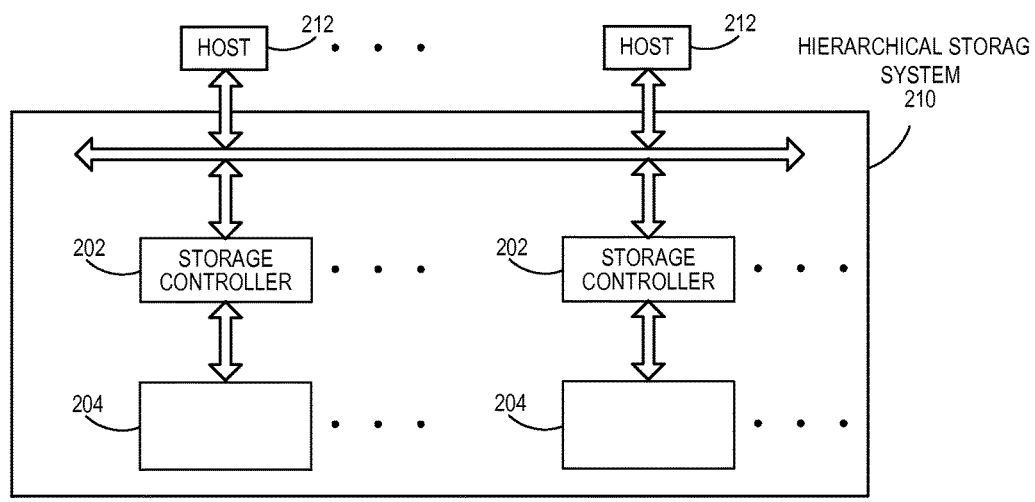
FIG. 1C is a block diagram of a hierarchical storage system.

FIG. 1C is a block diagram illustrating a hierarchical storage system. A hierarchical storage system 210 includes a plurality of storage controllers 202, each of which control a respective storage system 204. Host systems 212 may access memories within the hierarchical storage system via a bus interface. In one embodiment, the bus interface may be a non-volatile memory express (NVMe) or a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
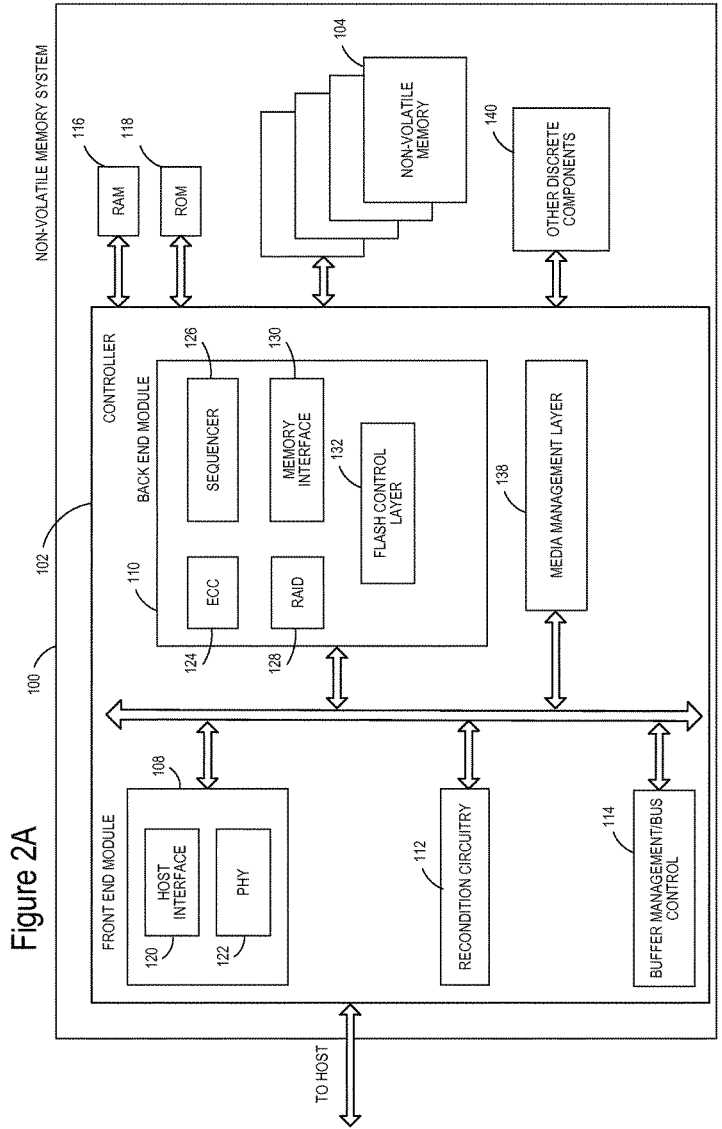
FIG. 2A is a block diagram of exemplary components of a controller of a non-volatile memory system.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail.

A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include memory hardware, such as a portion of the memory 104, for example, that comprises instructions executable with a processor to implement one or more of the features of the module. When any one of the modules includes the portion of the memory that comprises instructions executable with the processor, the module may or may not include the processor. In some examples, each module may just be the portion of the memory 104 or other physical memory that comprises instructions executable with the processor to implement the features of the corresponding module.

The controller 102 may include recondition circuitry 112. The recondition circuitry 112 may be used for reconditioning cells or blocks of memory. The reconditioning is described with respect to FIGS. 9-11. The reconditioning process may include operations performed by the controller with the recondition circuitry 112, such as the program/erase cycling of the memory and the temporary relocation of data for reconditioning memory.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller. Further, in some implementations, the controller 102, RAM 116, and ROM 118 may be located on separate semiconductor die.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include media management layer 138, which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

The FTL or MML 138 may be integrated as part of the flash management that may handle flash errors and interfacing with the host. In particular, MML may be a module in flash management and may be responsible for the internals of NAND management. In particular, the MML 138 may include an algorithm in the memory device firmware which translates writes from the host into writes to the flash memory 104. The MML 138 may be needed because: 1) the flash memory may have limited endurance; 2) the flash memory 104 may only be written in multiples of pages; and/or 3) the flash memory 104 may not be written unless it is erased as a block. The MML 138 understands these potential limitations of the flash memory 104 which may not be visible to the host. Accordingly, the MML 138 attempts to translate the writes from host into writes into the flash memory 104. As described below, erratic bits may be identified and recorded using the MML 138. This recording of erratic bits can be used for evaluating the health of blocks.

Figure 2B:
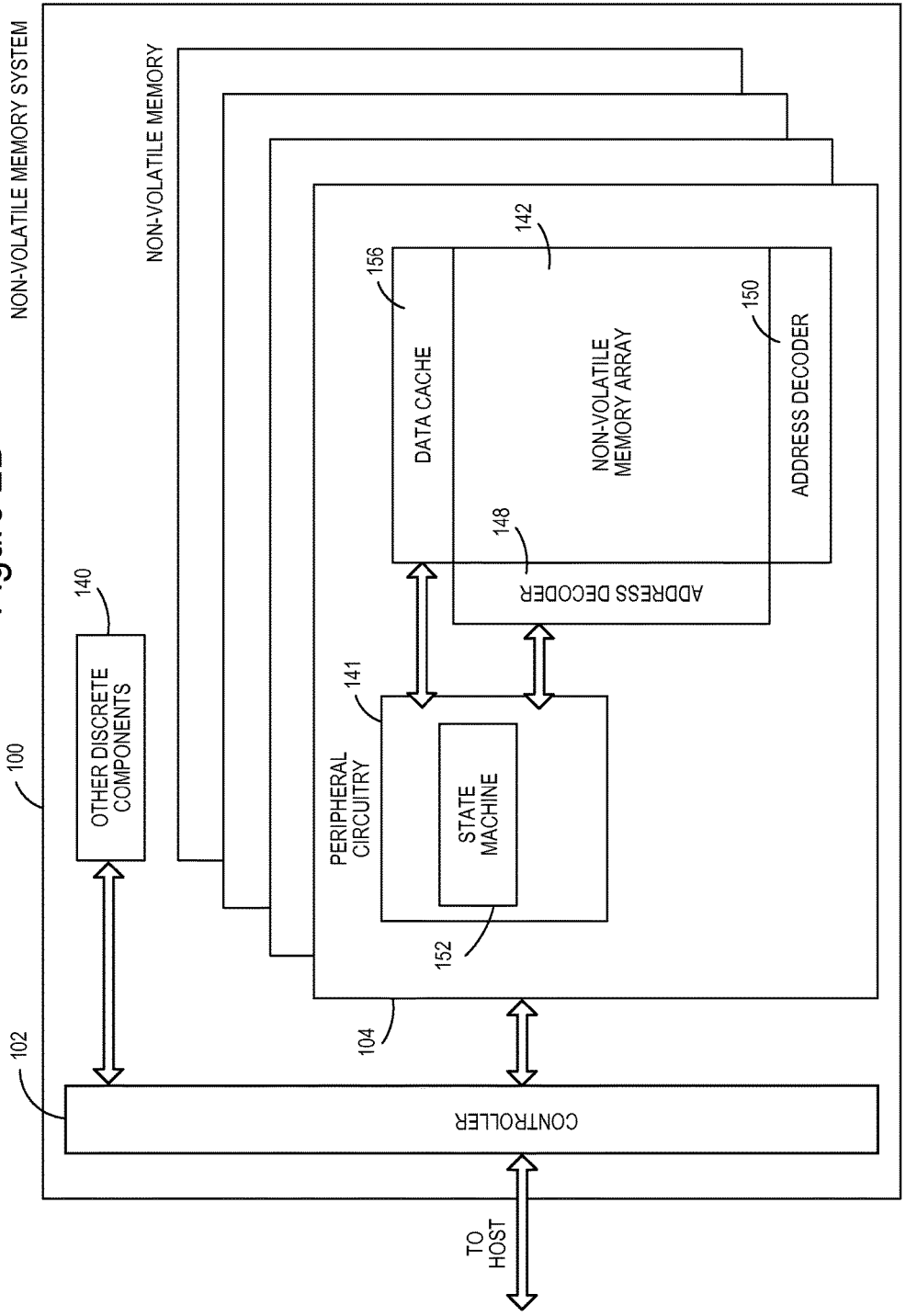
FIG. 2B is a block diagram of exemplary components of a non-volatile memory of a non-volatile memory storage system.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data. Exemplary peripheral circuitry 141 may include clocks, pumps, ESD, current shunt, current sink, and/or closely-packed logic circuits.

The logic interpretation of the program state is achieved by the NAND read circuits by setting appropriate read levels against the expected charge states. The data into and from the NAND chip may be controlled by the MCU or ASIC circuitry and a data processing algorithm unit of the system where the data is interpreted and further transferred to the host.

Figure 3:
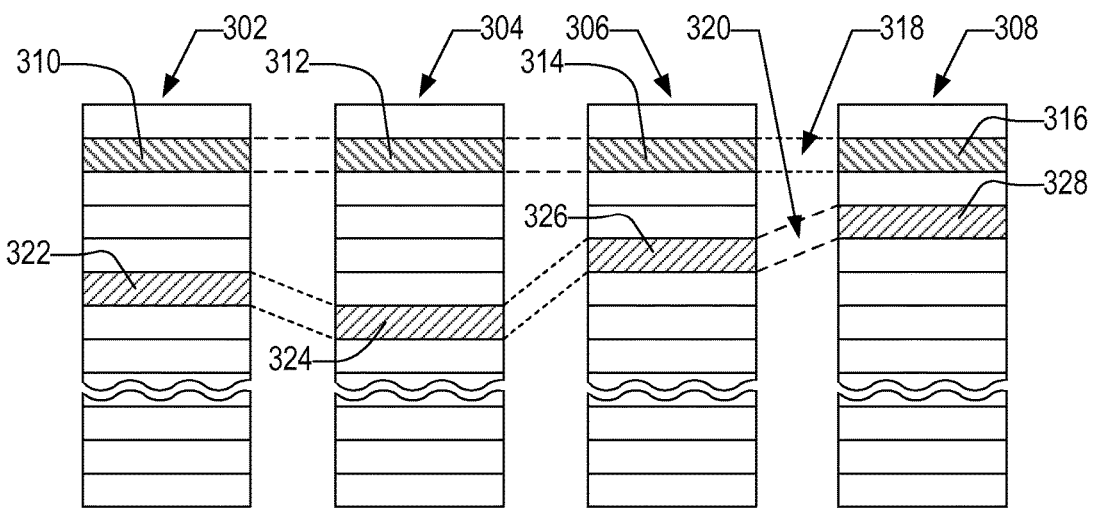
FIG. 3 is an example physical memory organization of the system of FIGS. 1A-2B.

FIG. 3 conceptually illustrates an organization of the flash memory 104 (FIGS. 1A-2B) as a cell array. The flash memory 104 may include multiple memory cell arrays which are each separately controlled by a single or multiple memory controllers 102. Four planes or sub-arrays 302, 304, 306, and 308 of memory cells may be on a single integrated memory cell chip, on two chips (two of the planes on each chip) or on four separate chips. Although, reconditioning may be described at the block level (e.g. reconditioning the memory block-by-block), the reconditioning may be at a different level (e.g. page level or meta-block level).

Other numbers of planes, such as 1, 2, 8, 16 or more may exist in a system. The planes may be individually divided into groups of memory cells that form the minimum unit of erase, hereinafter referred to as blocks. Blocks of memory cells are shown in FIG. 3 by rectangles, such as blocks 310, 312, 314, and 316, located in respective planes 302, 304, 306, and 308. There can be any number of blocks in each plane. The block of memory cells is the unit of erase, and the smallest number of memory cells that are physically erasable together. For increased parallelism, however, the blocks may be operated in larger metablock units or chunks. One block from each plane is logically linked together to form a metablock. The four blocks 310, 312, 314, and 316 are shown to form one metablock 318. All of the cells within a metablock are typically erased together. The blocks used to form a metablock need not be restricted to the same relative locations within their respective planes, as is shown in a second metablock 320 made up of blocks 322, 324, 326, and 328. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation. As described below with respect to FIG. 6, the meta-block may be created with planes from different dies. In other words, each meta-block includes planes from different dies.

Figure 4:
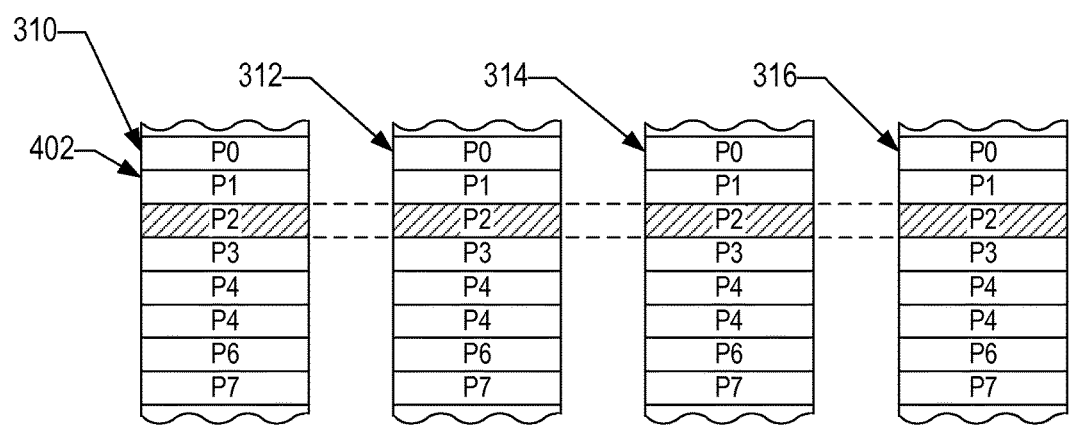
FIG. 4 is an expanded view of a portion of the physical memory of FIG. 3.

The individual blocks may be divided for operational purposes into pages of memory cells, as illustrated in FIG. 4. The memory cells of each of the blocks 310, 312, 314, and 316, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 402 is illustrated in FIG. 3, being formed of one physical page from each of the four blocks 310, 312, 314, and 316. The metapage 402, for example, includes the page P2 in each of the four blocks but the pages of a metapage need not necessarily have the same relative position within each of the blocks. A metapage may be the maximum unit of programming.

The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. For example, MLC memory may store four states and can retain two bits of data: 00 or 01 and 10 or 11. Both types of memory cells may be used in a memory, for example binary SLC flash memory may be used for caching data and MLC memory may be used for longer term storage. The charge storage elements of the memory cells described below may be a non-conductive dielectric charge trapping material.

Figure 5:
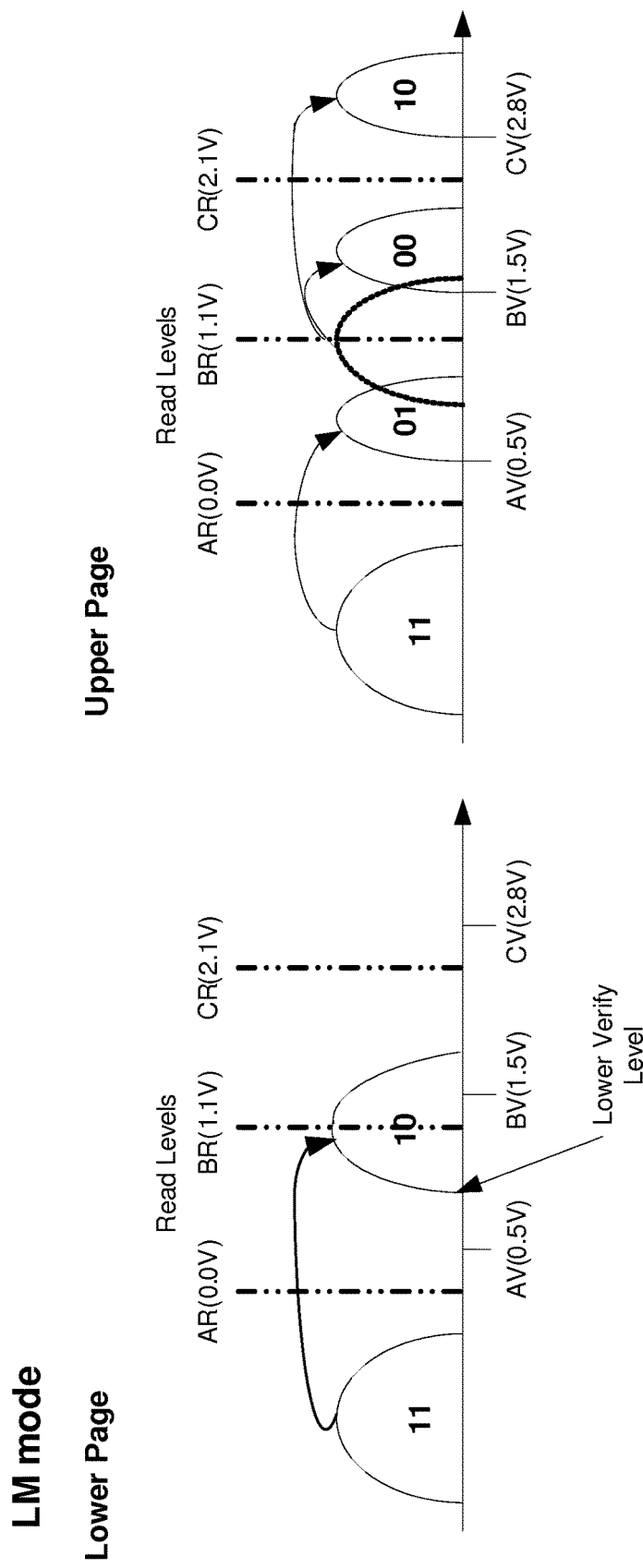
FIG. 5 is a diagram illustrating charge levels in a multi-level cell memory operated to store two bits of data in a memory cell.

FIG. 5 is a diagram illustrating charge levels in cell memory. The charge storage elements of the memory cells may include an insulating, non-conductive dielectric charge trapping (CT) material. Each cell or memory unit may store a certain number of bits of data per cell. In FIG. 5, MLC memory may store four states and can retain two bits of data: 00 or 01 and 10 or 11. Alternatively, MLC memory may store eight states for retaining three bits of data (not shown). In other embodiments, there may be a different number of bits per cell. As described, the reconditioning of CT based memory may be applicable regardless of the number of bits per cell.

The right side of FIG. 5 illustrates a memory cell that is operated to store two bits of data. This memory scheme may be referred to as eX2 memory because it has two bits per cell. The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. FIG. 5 illustrates a two-bit per cell memory scheme in which either four states (Erase, A, B, C) or with two states of SLC memory. Charge for a particular cell may be lost when the temperature rises (i.e. the charge is excited out of its cell), so improved data retention is necessary to maintain the integrity of the data. The reconditioning of the memory described herein may be used to help the memory maintain its states or charge levels regardless of outside conditions, such as temperature.

FIG. 5 illustrates one implementation of the four charge levels used to represent two bits of data in a memory cell. In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page. The read margins are established for identifying each state. The three read margins (AR, BR, CR) delineate the four states. Likewise, there is a verify level (i.e. a voltage level) for establishing the lower bound for programming each state.

FIG. 5 is labeled as LM mode which may be referred to as lower at middle mode and will further be described below regarding the lower at middle or lower-middle intermediate state. The LM intermediate state may also be referred to as a lower page programmed stage. A value of "11" corresponds to an un-programmed state or erase state of the memory cell. When programming pulses are applied to the memory cell to program a page bit of the lower page, the level of charge is increased to represent a value of "10" corresponding to a programmed state of the page bit of the lower page. The lower page may be considered a logical concept that represents a location on a multi-level cell (MLC). If the MLC is two bits per cell, a logical page may include all the least significant bits of the cells on the wordline that are grouped together. In other words, the lower page is the least significant bits. For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

Figure 6:
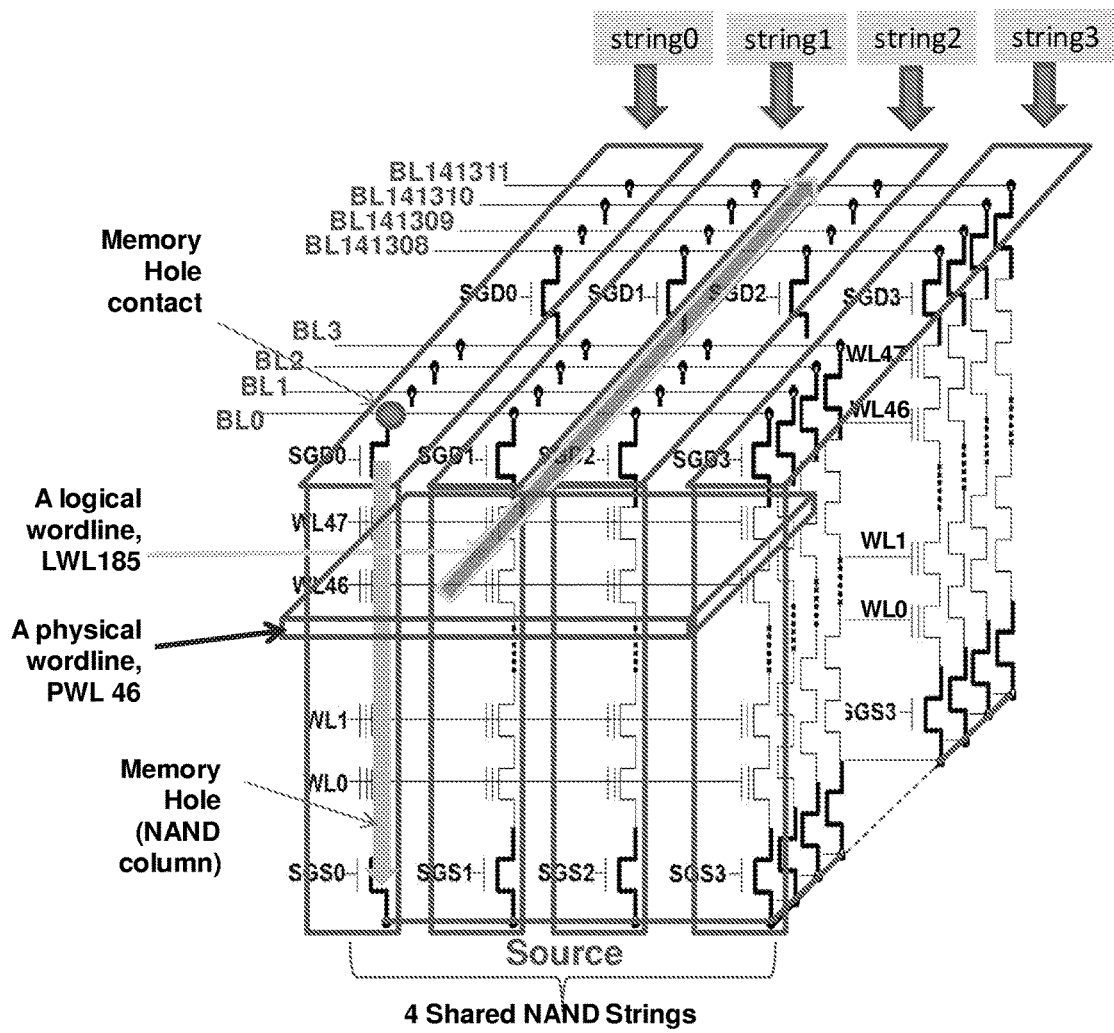
FIG. 6 is an illustration of an exemplary three-dimensional (3D) memory structure.

The memory reconditioning and data retention improvements described herein may be utilized in a charge trapping (CT) memory, such as the 3D memory illustrated in FIG. 6. FIG. 6 is an illustration of an exemplary three-dimensional (3D) memory structure. FIG. 6 illustrates an exemplary 3D NAND flash with Bit Cost Scaling (BiCS) using CT memory. The source lines and bit lines are further described an illustrated with respect to FIG. 7. The flash memory used in the storage system may be flash memory of 3D NAND architecture, where the programming is achieved through Fowler-Nordheim of the electron into the charge trapping layer (CTL). Erase may be achieved by using a hole injection into the CTL to neutralize the electrons, via physical mechanism such as gate induced drain leakage (GIDL). FIG. 6 is an exemplary 3D structure with each cell being represented by a memory transistor forming a memory column vertically (e.g., 48 wordlines). The wordlines (WL), bitlines (BL), and string number are shown in FIG. 6. Four exemplary strings are shown. There may be a memory hole (within a NAND column) that includes a memory hole contact. One exemplary wordline (logical wordline LWL 185) is illustrated along with an exemplary physical wordline (PWL 46).

Although described for 3D memory applications, the dynamic reconditioning may be to other structures, including 2D flash memory with charge trapping dielectric and tunneling dielectric. In particular, a charge trapping dielectric memory may be 3D or 2D. The CT layer architecture allows for PE cycle reconditioning that is applicable to both 2D and 3D NAND memory. For a 2D structure, there may be a planar structure on the wafer. For 3D structure, there may be a vertical structure perpendicular to the wafer.

Figure 7:
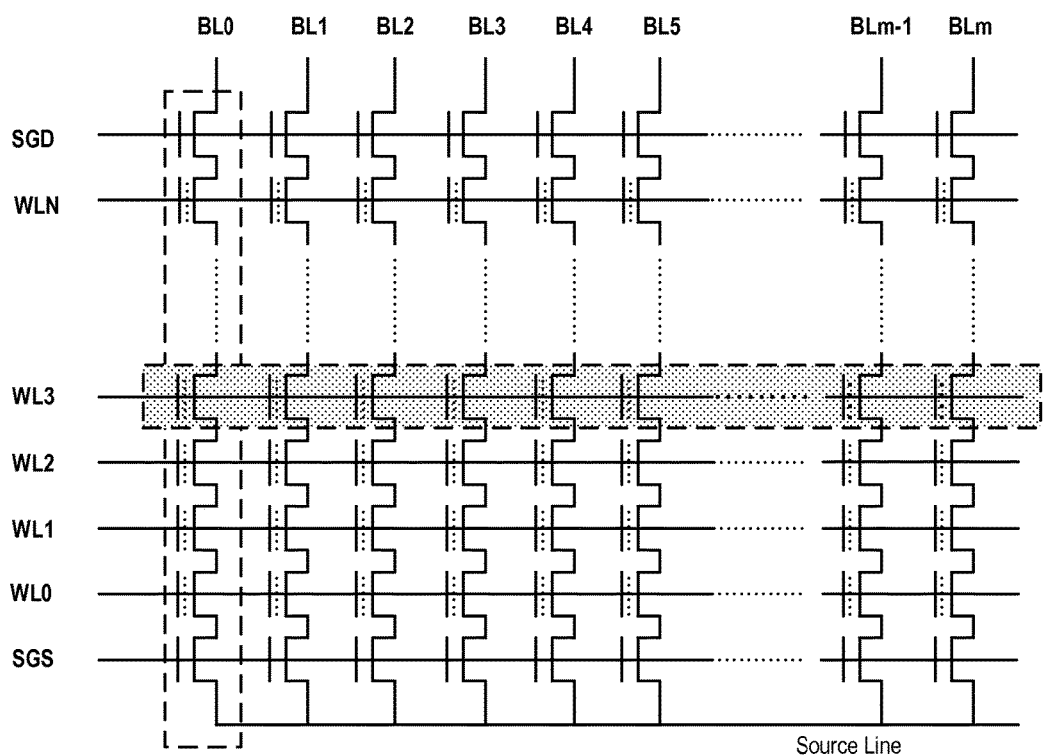
FIG. 7 is an exemplary physical memory organization of a memory block.

FIG. 7 is an exemplary physical memory organization of a memory block. FIG. 7 illustrates a page of memory cells, organized for example in the NAND configuration, being sensed or programmed in parallel. In one embodiment, FIG. 7 illustrates one of the strings of a 3D NAND architecture, where each wordline may span across multiple strings (either in front of or behind the string in FIG. 7). A bank of NAND chains are shown in the exemplary memory. A page may be any group of memory cells enabled to be sensed or programmed in parallel. The page is enabled by the control gates of the cells of the page connected in common to a wordline and each cell accessible by a sensing circuit accessible via a bit line (bit lines BL0-BLm). As an example, when respectively sensing or programming the page of cells, a sensing voltage or a programming voltage is respectively applied to a common word line (e.g. WL2) together with appropriate voltages on the bit lines. A silica gate drain (SGD) is shown opposite from a decoding gate, such as silica gate source (SGS). SGS may also be referred to as the source gate or source, while SGD may be referred to as the drain gate or drain. Directly adjacent to the source/drain gates may be dummy wordlines that act as buffers to separate the source/drain gates from the normal wordlines. The dummy wordlines may provide a buffer or barrier to protect the normal wordlines from potential defects.

As described, the memory structure may utilize charge trapping (CT) as opposed to a floating gate structure. In one embodiment, the charge trapping layer may be a dielectric, such as silicon nitride, magnesium oxide, or another insulator that is porous enough for electrons to be trapped in the pores. The silicon nitride may be a film that stores electrons. CT may use a SONOS (semiconductor-oxide-nitride-oxide-semiconductor) or MONOS (metal-oxide-nitride-oxide-semiconductor) capacitor structure, storing the information in charge traps in the dielectric layer. CT may be used for either non-volatile NOR or NAND flash memory. There may be a variable charge between a control gate and a channel to change a threshold voltage of a transistor. The CT layer may be an insulator, which provides improved endurance. The programming of the CT layer may include electron movement onto the CT layer with channel hot electron injection (HEI) or hot-carrier injection in which a high voltage is between the control gate with a medium voltage at the source and the drain, and a current is induced from the source to the drain. In another embodiment, Fowler Nordheim tunneling (FNT) may be an alternative when there is a high voltage on the control gate and a low voltage on the memory transistor's channel. Electrons are injected or tunneled into the CT layer by the biasing conditions. Hot hole injection may be utilized for removing a charge from the CT layer. In other words, adding holes (or positive charge because of a lack of electrons) may be used to erase.

Figure 8:
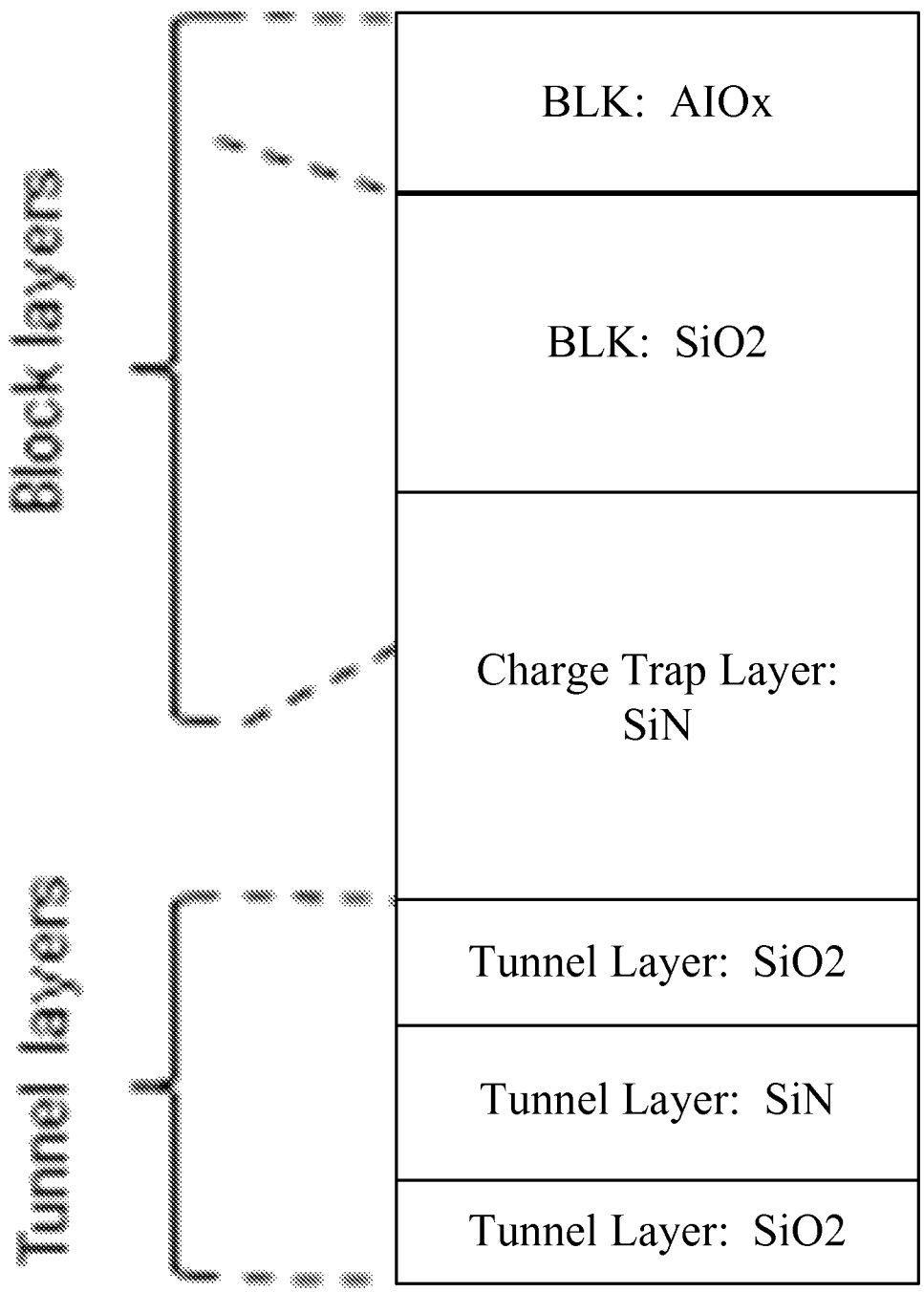
FIG. 8 is an example of a charge trapping layer.

FIG. 8 is an example of a charge trapping (CT) layer. The reconditioning described herein may refresh a CT based memory. FIG. 8 is merely one example of CT based memory. This may be an example of a MONOS structure. The block layers are aluminum oxide (AlOx) and silicon oxide (SiO2). The top layer may be the anode of the cell (i.e. wordline) and may reduce electron back tunneling during an erase operation. The SiO2 layer is insulation and may be thicker to improve program and erase saturation. The charge trap (CT) layer is in the middle and traps electrons (charge). The CT layer may be a silicon nitride or magnesium nitride. A thicker charge trap layer may lead to increased trap efficiency and reduces go-through current during programming. There may be three sub-tunnel layers to improve data retention and improve erase operations.

An increased temperature may inadvertently cause an erase with electrons trapped in the CT becoming de-trapped. Data retention ("DR") may refer to the ability of a memory bit to retain its data state over time and prevent inadvertent erasures. Poor DR means that a memory bit loses its data state (i.e. loses charge) faster than required. DR may be decreased when the temperature increases. The loss of charge in a memory cell may result in a change of state and data retention may result in the voltage distribution being improperly shifted downside. For example, the voltage distributions shown in FIG. 5 may shift, which means that the data may be read incorrectly when the voltage levels are not accurate.

Figure 9A:
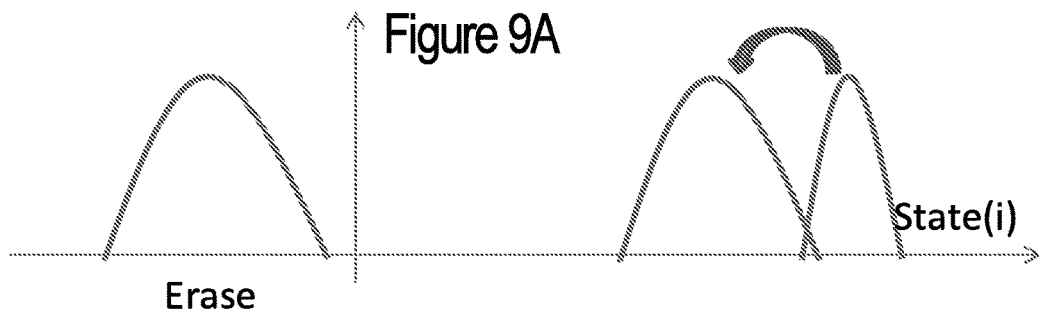
FIG. 9A is a diagram illustrating voltage distribution shifting.
Figure 9B:
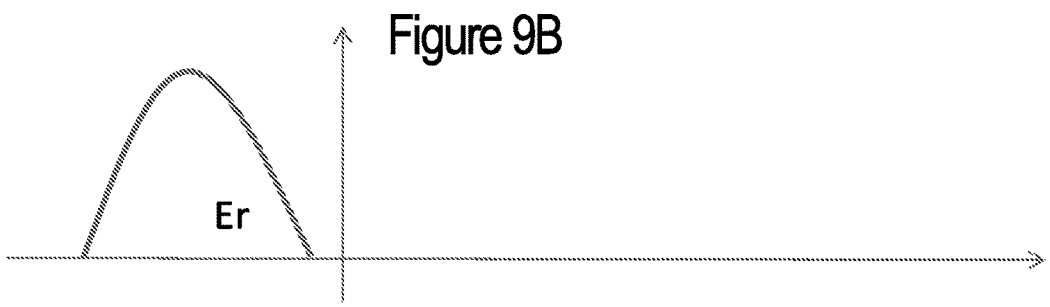
FIG. 9B is a diagram illustrating voltage distribution shifting.
Figure 9C:
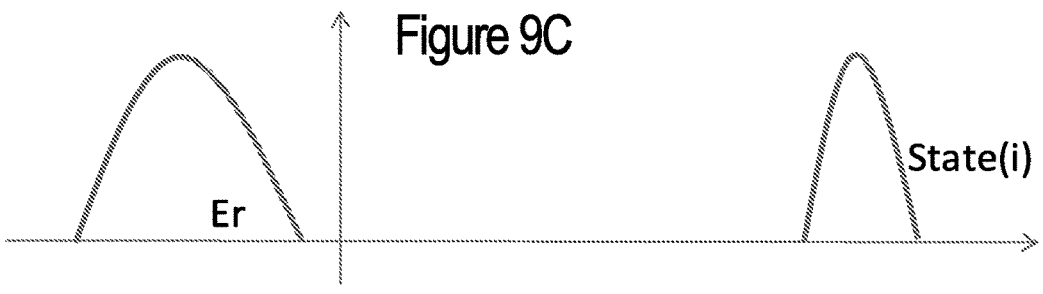
FIG. 9C is a diagram illustrating voltage distribution shifting.

The CT based memory may be reconditioned to improve data retention (DR). The reconditioning may result in reduced DR for future usage with better data retention characteristics. FIGS. 9a, 9b, 9c, and 9b are diagrams illustrating voltage level shifting for reconditioning memory. The reconditioning process may include a high temperature baking. The baking may include exposure to a high temperature (HT) for a period of time. In particular, FIGS. 9a-9d illustrate a single voltage state with voltage shifts caused by data retention problems and improved by memory reconditioning. The charge state distribution shown in FIGS. 9a-9d may be any charge state of a multi-level memory with multiple states. In particular, the value of i may be A, B, C, D, E, F, G, for X3 memory, or i=A, B, C for X2 memory, or i=A, B, . . . , O for X4 memory.

FIG. 9a illustrates a charge loss due to data retention. The data retention problem may be caused by a temperature increase. FIG. 9 shows that the voltage state shifts left after an initial bake. This represents a data loss (data retention problem) caused by exposure to a higher temperature.

FIG. 9b illustrates an erase of the block. This may be part of the reconditioning process. It may be a program/erase (PE) cycle in which the erasing of the block is used to recondition the block. If a dedicated program/erase (PE) cycle is performed on the memory, then additional HT bakes do not cause the DR shift. The dedicated PE cycle may recondition the memory and cause it to be resilient to future HT bakes (or high temperature exposure). This DR reconditioning may be because of the nature of using a CT layer where the unstable charge trapping sites become stabilized by this dedicated PE cycle. Accordingly, the memory can be DR reconditioned by applying a HT bake and then performing a program/erase cycle. Upon reconditioning, the memory is no longer subject to voltage shift from subsequent baking. In other words, when a memory has been reconditioned, high temperatures may not result in the same amount of DR problems that would result in non-reconditioned memory.

FIG. 9c illustrates a re-programming of the erased block. In particular, FIG. 9c illustrates the PE cycle completion (erasing in FIG. 9b and programming in FIG. 9c). After being reconditioned (by an erase cycle), the block is re-programmed with the data that was erased. The data may have been temporarily copied to another memory location (e.g. RAM or other good blocks in NAND) during the erase cycle and then moved from this temporary memory back to the reconditioned block.

Figure 9D:
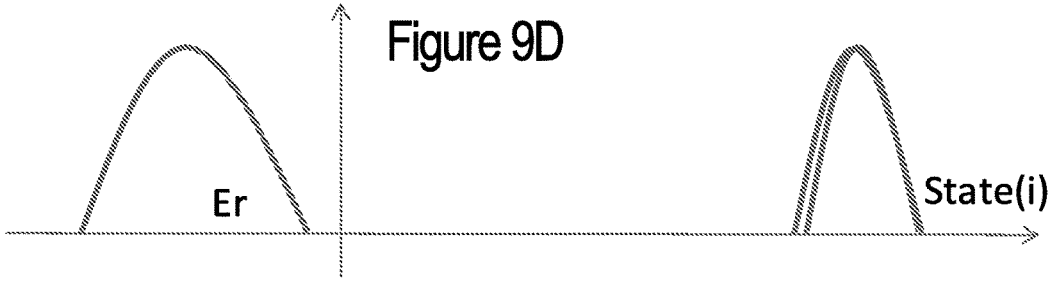
FIG. 9D is a diagram illustrating voltage distribution shifting.

FIG. 9d illustrates improved data retention. In particular, FIG. 9d illustrates that charge loss induced by data retention is decreased as compared with FIG. 9a, which shows charge loss due to normal (non-reconditioned memory) data retention problems. The reconditioned (erase cycle) improves the data retention of the memory which results in a much smaller voltage distribution shift despite exposure to a higher temperature.

The reconditioning described herein may not just be a mere "baking out" of a residual charge at the memory cells. Rather, the PE cycle reconditions and stabilizes the memory storage sites by cleaning up the shallow charging traps, rather than merely the residual charge being erased out of the memory cell. In one embodiment, the reconditioning process may be performed at manufacture such that outgoing memory is baked at HT and then cycled to create DR resilient memory. Alternatively, this process may be utilized during operation in the field application of the device using PE cycle once a DR has been detected.

Figure 10:
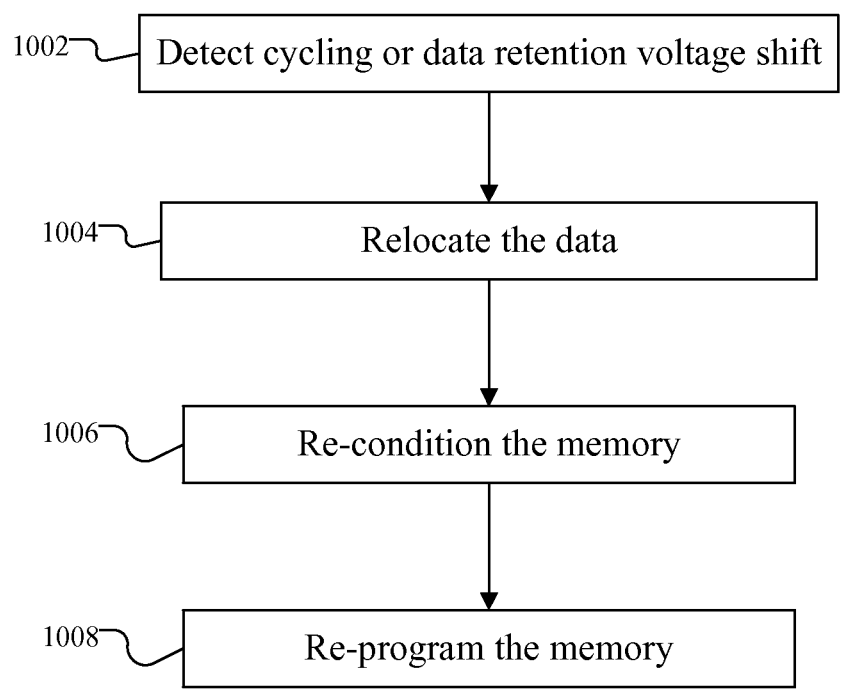
FIG. 10 is a flow chart for refreshing CT based memory.

FIG. 10 is a flow chart for refreshing CT based memory. In block 1002, a data retention voltage shift is detected. The voltage shift may include a voltage distribution shifting left as shown in FIG. 9. If a DR shift is detected on one or more dies of the system (e.g. by CVD read or other read level change), then the data for that memory portion may be relocated when there is spare capacity as in block 1004. In one embodiment, the relocation may be made with controller assistance using the system RAM and ECC engine. After data of the block is re-located (e.g. read out to a temporary RAM {SRAM or DRAM} in the controller), the block may be given one erase operation to re-condition the memory as in block 1006. Then the memory can be reprogrammed as in block 1008. As described, FIG. 10 may be performed at the block level (e.g. per block) or using a larger (e.g. meta-block or di level) or smaller portion (e.g. page level) of the memory.

In an alternative embodiment, upon detecting of a data retention problem, the data may be swapped out with an already reconditioned memory portion. For example, a block subject to DR voltage shifting may have its data transferred to a block that has been reconditioned. The reconditioned block can sustain more erase cycles and avoid the data loss that would have resulted from the DR voltage shifting.

In yet another embodiment, heavily cycled blocks may be automatically reconditioned. This may enhance the overall memory quality. Blocks may be identified as cold data and hot data with the block that has been re-condition as above. This may be useful for the wear leveling and for the cold/sequential data access and storage, which may be important for systems that may require fewer cycles but longer data retention.

Figure 11:
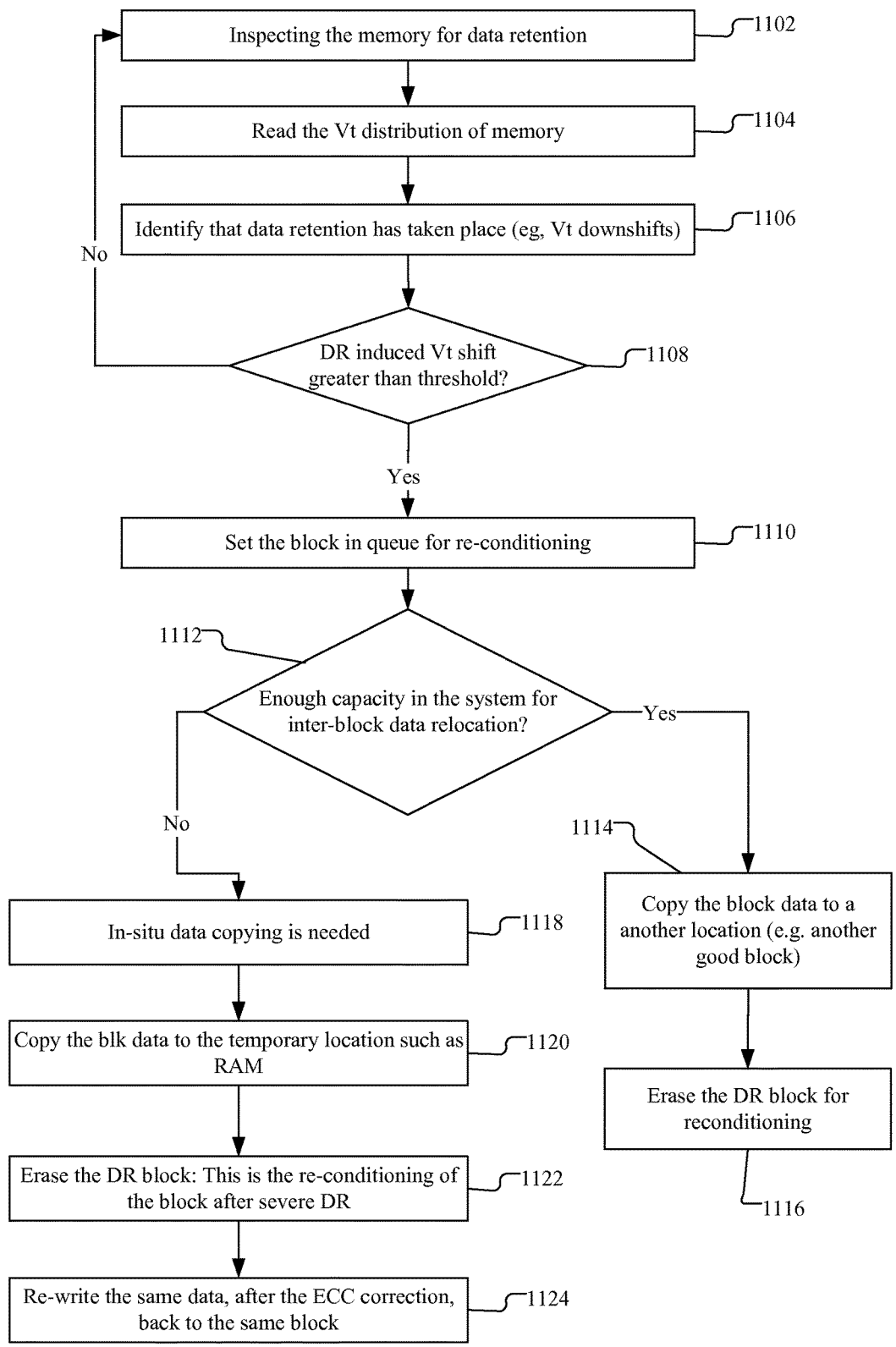
FIG. 11 is a flow chart implementing data retention reconditioning.

FIG. 11 is a flow chart implementing data retention reconditioning. FIG. 11 illustrates one embodiment for implementing reconditioning of CT based memory. In block 1102, the memory is inspected for data retention (DR) issues. The voltage (Vt) distribution of the memory may be read in block 1104. Data retention issues may be identified in block 1106. The DR problems may be indicated by a down shifting of a voltage distribution.

The shifting of the voltage may be compared with a threshold value in block 1108. The threshold may establish a safe level of DR, such that a shift that exceeds the threshold comprises an unsafe level of DR that may result in data loss. If the shift is less than the threshold, then the system continues to inspect the memory for data retention issues as in block 1102. If the voltage shift exceeds the threshold, then the block is set in a queue for reconditioning as in block 1110. The queue may include a list of blocks (or pages, metablocks, etc.) that need to be reconditioned. In block 1112, a determination is made as to whether the system includes sufficient capacity to relocate the data for the block stored in the queue.

If there is enough data in block 1112, then the data for the block in the queue is copied to another location as in block 1114. Then the block in the queue is reconditioned through the performing of an erase cycle in block 1116. The data may then be returned to the reconditioned block (not shown), but this is not required since it was determined that there was sufficient capacity in the system from block 1112.

If there is insufficient capacity in the system for data relocation in block 1112, then in-situ copying may be needed as in block 1118. The block data is copied to a temporary location, such as RAM in block 1120. The block in the queue is erased for reconditioning as in block 1122 and the data is then rewritten back to that block in block 1124. ECC correction may be used for rewriting the data from the temporary location back to the reconditioned block.

The methods, devices, processing, circuitry, and logic described above may be implemented in many different ways and in many different combinations of hardware and software. For example, all or parts of the implementations may be circuitry that includes an instruction processor, such as a Central Processing Unit (CPU), microcontroller, or a microprocessor; or as an Application Specific Integrated Circuit (ASIC), Programmable Logic Device (PLD), or Field Programmable Gate Array (FPGA); or as circuitry that includes discrete logic or other circuit components, including analog circuit components, digital circuit components or both; or any combination thereof. The circuitry may include discrete interconnected hardware components or may be combined on a single integrated circuit die, distributed among multiple integrated circuit dies, or implemented in a Multiple Chip Module (MCM) of multiple integrated circuit dies in a common package, as examples.

Accordingly, the circuitry may store or access instructions for execution, or may implement its functionality in hardware alone. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed. For instance, the circuitry may include multiple distinct system components, such as multiple processors and memories, and may span multiple distributed processing systems. Parameters, databases, and other data structures may be separately stored and managed, may be incorporated into a single memory or database, may be logically and physically organized in many different ways, and may be implemented in many different ways. Example implementations include linked lists, program variables, hash tables, arrays, records (e.g., database records), objects, and implicit storage mechanisms. Instructions may form parts (e.g., subroutines or other code sections) of a single program, may form multiple separate programs, may be distributed across multiple memories and processors, and may be implemented in many different ways. Example implementations include stand-alone programs, and as part of a library, such as a shared library like a Dynamic Link Library (DLL). The library, for example, may contain shared data and one or more shared programs that include instructions that perform any of the processing described above or illustrated in the drawings, when executed by the circuitry.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

In the present application, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magneto-resistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory. In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

It is intended that the foregoing detailed description be understood as an illustration of selected forms that the invention can take and not as a definition of the invention. It is only the following claims, including all equivalents that are intended to define the scope of the claimed invention. Finally, it should be noted that any aspect of any of the preferred embodiments described herein can be used alone or in combination with one another.

We claim:

1. A method for refreshing charge trap flash memory, the method comprising:
    detecting a data retention voltage shift in a portion of the charge trap flash memory;
    relocating data stored at the detected portion of the charge trap flash memory;
    reconditioning the detected portion of the charge trap flash memory by performing an erase cycle of the portion of the charge trap flash memory; and
    reprogramming, after the reconditioning, the detected portion of the charge trap flash memory with the previously relocated data or new data.

2. The method of claim 1 wherein the charge trap flash memory comprises a dielectric layer for trapping electrons, wherein the dielectric layer is a silicon nitride film.

3. The method of claim 2 wherein the charge trap flash memory comprises a metal oxide nitride oxide semiconductor (MONOS) capacitor structure.

4. The method of claim 1 wherein the charge trap flash memory comprises a three-dimensional (3D) NAND memory configuration, and wherein a controller is associated with operation of and storing to the charge trap flash memory.

5. The method of claim 1 wherein the reconditioning improves data retention by resisting voltage distribution shifting during high temperature exposures.

6. The method of claim 1 wherein the relocating comprises copying the data to another portion of the memory that had no data and has not been subject to a data retention voltage shift and the reprogramming comprises copying the data from the another portion back to the detected portion of the charge trap flash memory.

7. The method of claim 6 wherein the reconditioning comprises a dedicated erase-program cycle after the detecting.

8. The method of claim 1 wherein the relocating comprises copying the data to random access memory (RAM) and the reprogramming comprises copying the data from the RAM back to the detected portion of the charge trap flash memory after reconditioning.

9. The method of claim 1 further comprising:
    applying a high temperature bake to the charge trap flash memory in advance of the reconditioning wherein the reconditioning results in a resistance to voltage shift from exposure to a subsequent high temperature bake.

10. The method of claim 1 further comprising:
    programming, after the reconditioning, the detected portion of the charge trap flash memory with new data.

11. The method of claim 1 further comprising:
    adding each of the detected portions of the charge trap flash memory to a queue, wherein the reconditioning utilizes the queue for selecting which portions are reconditioned.

12. A storage device comprising:
    a memory comprising memory blocks for data storage, wherein the memory comprises a dielectric layer for charge trapping;
    a controller coupled with the memory for programming the memory blocks; and
    detection circuitry that dynamically detects data retention shifts of the memory cell voltage, and
    recondition circuitry that subsequently reconditions one or more of the memory blocks by performing a dedicated erase program cycle for the one or more memory blocks to improve data retention for charge trapped in the dielectric layer.

13. The storage device of claim 12 wherein the memory comprises a charge trap flash memory with the charge trapped in the dielectric layer.

14. The storage device of claim 13 wherein the dielectric layer comprises a silicon nitride film.

15. The storage device of claim 12 wherein the recondition circuitry is part of the controller and the performing the erase cycle is performed by the controller.

16. The storage device of claim 12 wherein the memory comprises a three-dimensional (3D) memory configuration.

17. The storage device of claim 12 wherein the data retention improvement comprises a resistance to voltage distribution shifting during high temperature exposure.

18. The storage device of claim 17 wherein the reconditioning is performed after a high temperature bake of the storage device.

* * * * *